United States Patent
Sawasaki

(10) Patent No.: US 6,884,631 B2
(45) Date of Patent: Apr. 26, 2005

(54) METHOD OF FORMING A FERROELECTRIC FILM BY DIRECT ANNEALING OF THE FERROELECTRIC FILM USING LASER OR LAMP FOLLOWED BY A SECOND ANNEALING THROUGH A LIGHT TRANSMISSION AND/OR ABSORPTION FILM

(75) Inventor: Tatsuo Sawasaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/397,431

(22) Filed: Mar. 27, 2003

(65) Prior Publication Data

US 2004/0080991 A1 Apr. 29, 2004

(30) Foreign Application Priority Data

Mar. 29, 2002 (JP) .......................... 2002-095058

(51) Int. Cl.⁷ ............................... H01L 21/00
(52) U.S. Cl. ..................... 438/3; 438/240; 438/393; 438/396
(58) Field of Search ..................... 438/3, 240, 393, 438/396

(56) References Cited

U.S. PATENT DOCUMENTS

| | | | |
|---|---|---|---|
| 5,348,775 A | 9/1994 | Lin | |
| 5,372,859 A | * 12/1994 | Thakoor | ...................... 427/551 |
| 5,375,085 A | 12/1994 | Gnade et al. | |
| 2002/0031846 A1 | 3/2002 | Natori | |

FOREIGN PATENT DOCUMENTS

| | | |
|---|---|---|
| JP | A 5-343642 | 12/1993 |
| JP | A 6-283433 | 10/1994 |
| JP | A 7-320539 | 12/1995 |
| JP | A 2000-144419 | 5/2000 |
| JP | A 2001-94064 | 4/2001 |
| JP | A 2002-57301 | 2/2002 |

OTHER PUBLICATIONS

Yongfei Zhu et al; "Laser–Assisted Low Temperature Processing of PB(ZR, TI) O₃ Thin Film"; Applied Physics Letters; vol. 73, No. 14; Oct. 1998 pp 1958–1960.

U.S. Appl. No. 10/397,315, filed Mar. 27, 2003, Sawasaki.

* cited by examiner

*Primary Examiner*—Douglas Wille
*Assistant Examiner*—Anh Duy Mai
(74) *Attorney, Agent, or Firm*—Oliff & Berridge, PLC

(57) ABSTRACT

In a method of forming a ferroelectric film according to the present invention, pulsed laser light or pulsed lamp light is applied to an amorphous oxide film formed over a substrate to form microcrystalline nuclei of oxide in the oxide film. A light transmission and/or absorption film is formed over the oxide film. Crystallization of the oxide is performed by applying pulsed laser light or pulsed lamp light from above the light transmission and/or absorption film to form a ferroelectric film.

18 Claims, 13 Drawing Sheets

METHOD OF FORMING A FERROELECTRIC FILM BY DIRECT ANNEALING OF THE FERROELECTRIC FILM USING LASER OR LAMP FOLLOWED BY A SECOND ANNEALING THROUGH A LIGHT TRANSMISSION AND/OR ABSORPTION FILM

Japanese Patent Application No. 2002-95058 filed on Mar. 29, 2002, is hereby incorporated by reference in its entirety.

BACKGROUND OF THE INVENTION

The present invention relates to a method of forming a ferroelectric film, a ferroelectric memory, a method of manufacturing the ferroelectric memory, a semiconductor device, and a method of manufacturing the semiconductor device.

A ferroelectric memory (FeRAM) retains data by spontaneous polarization of a ferroelectric film used in a capacitor section. In recent years, a semiconductor device utilizing the ferroelectric memory has attracted attention.

Conventionally, a ferroelectric film having good characteristics is formed by crystallizing a ferroelectric material by a heat treatment at a high temperature. For example, a heat treatment at a temperature as high as 600 to 700° C. is necessary for crystallizing $Pb(Zr,Ti)O_3$ (PZT), and a heat treatment at a temperature as high as 700 to 800° C. is necessary for crystallizing $SrBi_2Ta_2O_9$ (SBT). The ferroelectric material is crystallized by using a heat treatment furnace, for example.

However, the heat treatment at a high temperature causes elements to be significantly damaged. For example, characteristics of a peripheral section such as an electrode deteriorate due to atom diffusion. In the case where other semiconductor devices such as transistors are integrated in a ferroelectric memory, characteristics of the transistors and the like deteriorate due to thermal load applied by the high-temperature heat treatment.

BRIEF SUMMARY OF THE INVENTION

The present invention may provide a method of forming a ferroelectric film capable of reducing thermal load applied during crystallization of a ferroelectric. The present invention may also provide a method of manufacturing a ferroelectric memory by using the method of forming a ferroelectric film of the present invention, and a ferroelectric memory manufactured by using this method. The present invention may further provide a method of manufacturing a semiconductor device by using the method of manufacturing a ferroelectric memory of the present invention, and a semiconductor device manufactured by using this method.

A method of forming a ferroelectric film according to one aspect of the present invention comprises:

applying pulsed laser light or pulsed lamp light to an amorphous oxide film formed over a substrate to form microcrystalline nuclei of oxide in the oxide film, forming a light transmission and/or absorption film over the oxide film, and applying pulsed laser light or pulsed lamp light to the oxide film from above the light transmission and/or absorption film to crystallize the oxide, so that a ferroelectric film is formed.

Figure 1A:
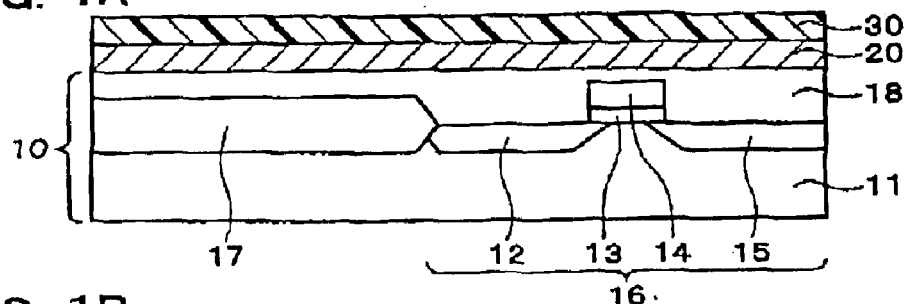
FIGS. 1A to 1D are views illustrating manufacturing steps of a ferroelectric memory according to the first embodiment of the present invention.

DETAILED DESCRIPTION OF THE EMBODIMENT (1) A method of forming a ferroelectric film according to one embodiment of the present invention comprises:

applying pulsed laser light or pulsed lamp light to an amorphous oxide film formed over a substrate to form microcrystalline nuclei of oxide in the oxide film, forming a light transmission and/or absorption film over the oxide film, and applying pulsed laser light or pulsed lamp light to the oxide film from above the light transmission and/or absorption film to crystallize the oxide, so that a ferroelectric film is formed.

In this method of forming a ferroelectric film, crystallization of the amorphous oxide in the film formed over the substrate is performed in a plurality of stages. The oxide crystallizes after forming the light transmission and/or absorption film over the oxide film. First, when pulsed laser light or pulsed lamp light is applied to the oxide film, impurities are removed and the microcrystalline nuclei of oxide are formed by utilizing thermal energy of the laser light or the lamp light. Next, the light transmission and/or absorption film which at least either transmits or absorbs laser light or lamp light is formed over the oxide film. Then, pulsed laser light or pulsed lamp light is applied from above the light transmission and/or absorption film. As a result, thermal energy of the laser light or the lamp light is provided to the oxide film through the light transmission and/or absorption film, whereby the oxide crystallizes to form the ferroelectric film.

According to this method of forming a ferroelectric film, the film can be heated in a short period of time by applying pulsed laser light or pulsed lamp light capable of instantaneously providing high energy. Therefore, according to this method of forming a ferroelectric film, thermal load applied to a portion other than the portion in which crystallization is performed can be reduced. Moreover, impurities can be removed by applying pulsed laser light or pulsed lamp light before crystallizing the oxide. Furthermore, since the light transmission and/or absorption film is formed before crystallizing the oxide, the oxide is not vaporized or sublimated by thermal energy of laser light or lamp light applied for crystallization. Therefore, a high-quality ferroelectric film can be formed without causing deformation due to lattice displacement in ferroelectric crystals.

The term "formed over . . . " used herein is not limited to a case where a component is directly formed over another component, and includes a case where a component is formed over another component with a predetermined layer interposed in between. The term "pulsed" used herein refers to a state in which laser light or lamp light is applied a plurality of times at predetermined intervals. The intervals may be either constant or irregular.

(2) A method of forming a ferroelectric film according to another embodiment of the present invention comprises:

applying pulsed laser light only to a predetermined portion of an amorphous oxide film formed over a substrate to form microcrystalline nuclei of oxide in the oxide film, forming a light transmission and/or absorption film over the oxide film, and applying pulsed lamp light to the oxide film from above the light transmission and/or absorption film to crystallize the oxide in the predetermined portion, so that a ferroelectric film is formed.

According to this method of forming a ferroelectric film, crystallization of the amorphous oxide in the film is performed in a plurality of stages as in the method described in (1). However, this method of forming a ferroelectric film differs from the method described in (1) in that impurities and the like are removed and the microcrystalline nuclei of oxide are formed by applying pulsed laser light only to a predetermined portion of the film. This allows crystallization to occur only in the predetermined portion in which both of the laser light and lamp light are applied by applying pulsed lamp light to the film when forming the ferroelectric film.

Therefore, effects the same as those of the method described in (1) can be obtained by this method of forming a ferroelectric film. Moreover, according to this method of forming a ferroelectric film, thermal load can be reduced and only a desired portion can be efficiently crystallized by applying laser light only to a predetermined portion.

(3) A method of forming a ferroelectric film according to further embodiment of the present invention comprises:

applying pulsed lamp light to an amorphous oxide film formed over a substrate to form microcrystalline nuclei of oxide in the oxide film, forming a light transmission and/or absorption film over the oxide film, and applying pulsed laser light only to a predetermined portion of the oxide film from above the light transmission and/or absorption film to crystallize the oxide in the predetermined portion, so that a ferroelectric film is formed.

According to this method of forming a ferroelectric film, effects the same as those of the method described in (1) can be obtained. Moreover, according to this method of forming a ferroelectric film, crystallization is performed only in the portion in which both lamp light and laser light are applied by applying pulsed laser light only to a predetermined portion of the film. Therefore, thermal load can be further reduced and only a desired portion can be efficiently crystallized.

(4) A method of forming a ferroelectric film according to still another embodiment of the present invention comprises:

applying pulsed laser light or pulsed lamp light to an amorphous oxide film formed over a substrate, after the applying of pulsed laser light or pulsed lamp light to the amorphous oxide film, forming a light transmission and/or absorption film over the oxide film, and applying pulsed laser light or pulsed lamp light to the oxide film from above the light transmission and/or absorption film to crystallize the oxide, so that a ferroelectric film is formed.

According to this method of forming a ferroelectric film, thermal load applied to a portion other than the portion in which crystallization is performed can also be reduced. Moreover, according to this method of forming a ferroelectric film, a high-quality ferroelectric film can be formed by preventing a ferroelectric material from being vaporized or sublimated by forming the light transmission and/or absorption film.

The methods of forming a ferroelectric film according to embodiments of the present invention may have any of the following features.

(A) The method may comprise forming a light blocking film over the light transmission and/or absorption film and a portion other than the predetermined portion in which microcrystalline nuclei is formed.

According to this feature, light is not applied to a portion other than the portion in which crystallization into the ferroelectric is performed by covering a portion other than the predetermined portion with the light blocking film. Therefore, thermal load applied to a portion other than the predetermined portion can be significantly reduced.

(B) The light transmission and/or absorption film may be formed over the oxide film only in the predetermined portion, and a light blocking film may be formed over the oxide film in a portion other than the predetermined portion.

According to this feature, since light is not applied to a portion other than the portion in which crystallization into the ferroelectric is performed by covering a portion other than the predetermined portion with the light blocking film, thermal load applied to a portion other than the predetermined portion can be significantly reduced.

(C) The amorphous oxide film may be formed over the substrate with at least a light reflection film interposed in between.

According to this feature, since light which is transmitted through the oxide film when applying laser light or lamp light can be reflected by the light reflection film and utilized for the heat treatment, crystallization into the ferroelectric can be efficiently performed in a shorter period of time.

(5) A method of manufacturing a ferroelectric memory according to still further embodiment of the present invention comprises forming a ferroelectric layer by using any one of the above methods of forming a ferroelectric film.

According to this method of manufacturing a ferroelectric memory, thermal load applied when forming the ferroelectric layer can be reduced, and also the crystallizing oxide can be prevented from being vaporized or sublimated. Therefore, characteristics and yield of the resulting device can be improved, whereby productivity can be increased.

This method of manufacturing a ferroelectric memory may comprise etching at least the oxide film including the microcrystalline nuclei when forming the ferroelectric layer, and the etching may be performed at least before crystallizing the oxide.

According to this feature, at least the oxide film after forming the microcrystalline nuclei is etched into a predetermined shape before forming the ferroelectric layer by crystallizing the oxide. In this case, an electrode and the like can also be etched. Crystallization can be performed while restoring etching damage to the oxide film by applying laser light or lamp light to the oxide film through the light transmission and/or absorption film.

In this method of manufacturing a ferroelectric memory, the light transmission and/or absorption film provided over the ferroelectric layer may be formed as an electrode when forming the ferroelectric layer.

(6) A ferroelectric memory according to yet another embodiment of the present invention is manufactured by using any one of the above methods of manufacturing a ferroelectric memory.

A ferroelectric memory according to yet further embodiment of the present invention is a ferroelectric memory comprising a plurality of memory cell arrays stacked over a substrate, wherein each of the memory cell arrays comprises:

a plurality of stripe-shaped lower electrodes and a plurality of stripe-shaped upper electrodes, the lower electrodes and the upper electrodes being disposed so as to intersect each other, and a ferroelectric layer disposed between the lower electrodes and the upper electrodes at least in intersecting portions of the lower electrodes and the upper electrodes, and wherein the lower electrodes and the upper electrodes are disposed in a manner that intersecting portions of the lower electrodes and the upper electrodes in adjacent two memory cell arrays among the memory cell arrays do not overlap each other.

This ferroelectric memory has a novel structure in which intersecting portions of the lower electrodes and the upper electrodes in adjacent two memory cell arrays among the memory cell arrays do not overlap each other.

This ferroelectric memory is suitably manufactured by using a method of manufacturing a ferroelectric memory given below.

In this method of manufacturing a ferroelectric memory, the upper electrodes of the memory cell arrays can be formed as light transmission and/or absorption films, and the ferroelectric layer of the ferroelectric memory can be formed by using any one of the above methods of forming a ferroelectric film.

According to this method of manufacturing a ferroelectric memory, the ferroelectric layer can be formed by crystallizing the oxide by applying laser light or lamp light from above the ferroelectric memory through the upper electrodes of each of the memory cell arrays. Therefore, according to this method of manufacturing a ferroelectric memory, a ferroelectric memory having good characteristics can be obtained by preventing the oxide from being vaporized or sublimated.

In this method of manufacturing a ferroelectric memory, after stacking at least two of the memory cell arrays, the ferroelectric layer may be formed by crystallizing oxide in each of the memory cell arrays.

According to this method of manufacturing a ferroelectric memory, since oxide crystallizes in a state in which a plurality of memory cell arrays are stacked, production efficiency can be increased.

(7) The methods of manufacturing a ferroelectric memory may be applied to a method of manufacturing a semiconductor device which includes a memory cell region having a ferroelectric layer and a circuit region. This method of manufacturing the semiconductor device comprises:

forming the memory cell region in a predetermined area over a substrate, and forming the circuit region over the substrate in an area other than the memory cell region, wherein, when forming the circuit region, a light blocking film is formed over the circuit region, and wherein, when forming the memory cell region, the ferroelectric layer is formed by using any one of the above methods of manufacturing a ferroelectric memory, after forming at least the light blocking film.

According to this method of manufacturing a semiconductor device, since thermal load applied to the circuit region other than the memory cell region including the ferroelectric layer can be reduced by using the light blocking film, the degrees of freedom of the manufacturing process are increased. Moreover, according to this method of manufacturing a semiconductor device, thermal load applied to the circuit region other than the memory cell region is reduced. Therefore, according to this method of manufacturing a semiconductor device, metal interconnects and the like do not deteriorate during heating for crystallization, whereby characteristics and yield of the resulting device can be maintained favorably.

(8) A semiconductor device according to yet further embodiment of the present invention comprises:

a memory cell region including a ferroelectric layer and a circuit region which is disposed over a substrate in an area other than the memory cell region, the semiconductor device being manufactured by using the above method of manufacturing a semiconductor device.

Preferred embodiments of the present invention are described below with reference to the drawings.

1. First Embodiment

FIGS. 1A to 1D are views schematically showing an example of manufacturing steps of a ferroelectric memory 1000 according to the first embodiment of the present invention.

As shown in FIG. 1A, a lower electrode 20 and an oxide film 30 formed of a ferroelectric material are successively stacked over a base 10 in which a transistor 16 is formed over a substrate 11. The transistor 16 is a MOS transistor made up of a source and/or drain 12 and 15, a gate insulating film 13, and a gate 14. The transistor 16 may be formed by using a conventional method.

Figure 1B:
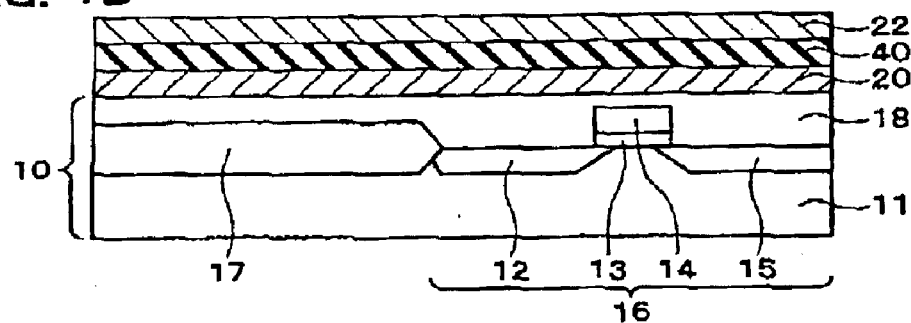

As shown in FIG. 1B, pulsed laser light or pulsed lamp light is applied to the oxide film 30 to form microcrystalline nuclei 40 of oxide. An upper electrode 22 is then formed over the film including the microcrystalline nuclei 40. The upper electrode 22 is formed as a light transmission and/or absorption film which at least either transmits or absorbs laser light or lamp light applied for crystallizing the oxide as described later. The upper electrode 22 may be formed of an oxide conductor. As specific examples of the oxide conductor, ITO (Indium Tin Oxide: $In_2O_3$—$SnO_2$), SRO ($SrRuO_x$), LSCO ($La_xSr_{1-x}CoO_3$), YBCO ($YBa_2Cu_3O_7$), $IrO_x$, and the like can be given. Since these materials at least either transmit or absorb light, the oxide can be crystallized by applying laser light or lamp light even after forming the upper electrode 22.

Figure 1C:
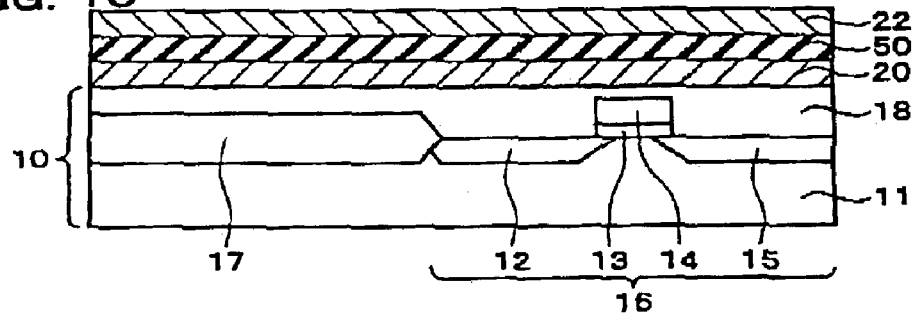

As shown in FIG. 1C, a ferroelectric film (ferroelectric layer) 50 is formed by completely crystallizing the oxide by applying pulsed laser light or pulsed lamp light from above the upper electrode 22.

The steps shown in FIGS. 1A to 1C are hereinafter collectively called a film formation step. In the film formation step, a portion in which the ferroelectric film 50 is formed by crystallizing the oxide may be either the entire oxide film 30 or only a desired area of the oxide film 30 taking an etching step as described later into consideration.

The lower electrode 20, the ferroelectric film 50, and the upper electrode 22 are etched to form a ferroelectric capacitor 100. The etching step may be performed by using a conventional etching method.

The crystallization step of the oxide shown in FIG. 1C may be performed after the etching step. In this case, the oxide film after forming the microcrystalline nuclei 40, the upper electrode 20, and the lower electrode 22 are etched into a predetermined shape before forming the ferroelectric film 50 by crystallizing the oxide. In this stage, it suffices that at least the oxide film be etched. The oxide can be crystallized while restoring etching damage to the oxide film by applying pulsed laser light or pulsed lamp light to the oxide film through the upper electrode 22.

Figure 1D:
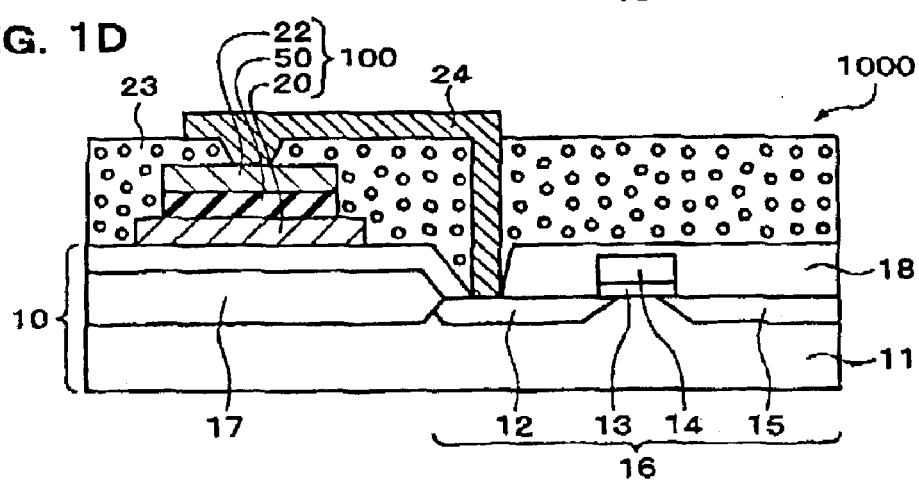

After forming an insulating layer 23 over the ferroelectric capacitor 100, the transistor 16 is connected with the ferroelectric capacitor 100 through an interconnection layer 24 to obtain the ferroelectric memory 1000 as shown in FIG. 1D.

In the case of forming a plurality of ferroelectric memories 1000 over the substrate 11, each of the ferroelectric memories 1000 is isolated from the others by forming an element isolation region 17. The ferroelectric capacitor 100 is electrically insulated from the transistor 16 in a portion other than the interconnection layer 24 by an interlayer dielectric 18 formed of a material such as silicon oxide in the base 10.

Examples of the film formation step in the method of manufacturing the ferroelectric memory 1000 according to the present embodiment are described below.

In the following examples, the oxide crystallizes by using irradiation apparatuses illustrated in FIGS. 2A and 2B, for example.

Figure 2A:
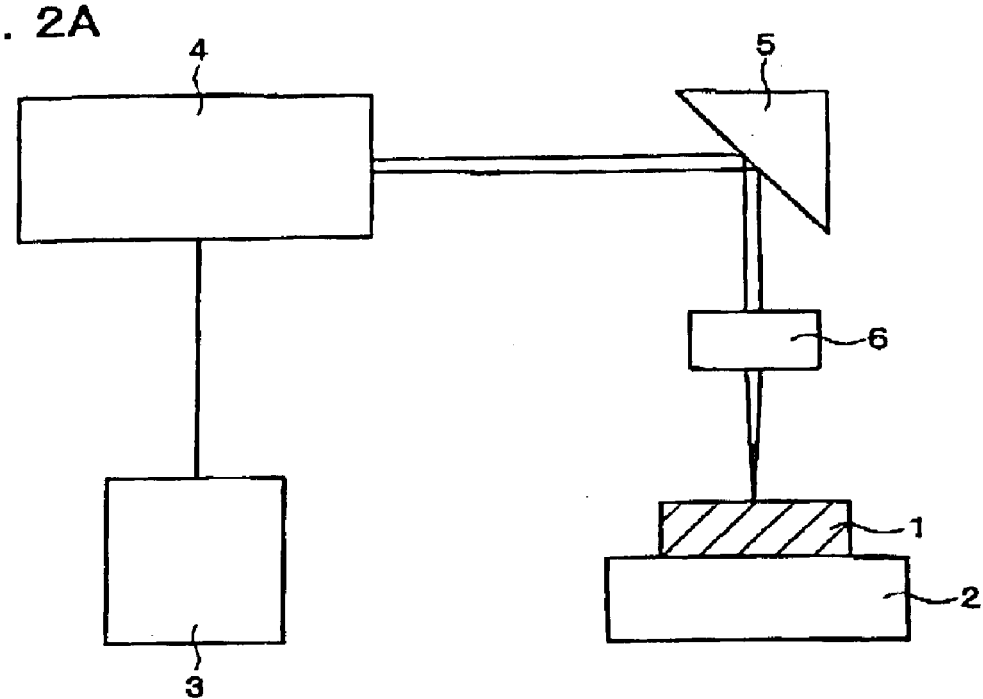
FIG. 2A is a view schematically showing a laser irradiation apparatus used in the manufacturing steps of a ferroelectric memory according to the first embodiment of the present invention.

FIG. 2A is a view schematically showing an example of a laser irradiation apparatus. In this laser irradiation apparatus, laser light emitted from a laser 4 which outputs light at a predetermined wavelength can be applied to a target 1 placed on a stage 2 through a mirror 5 and a lens 6. The stage 2 and the laser 4 are controlled by a control device 3 so that pulsed light can be applied to a desired portion of the target 1 by repeatedly outputting laser light at predetermined intervals.

Figure 2B:
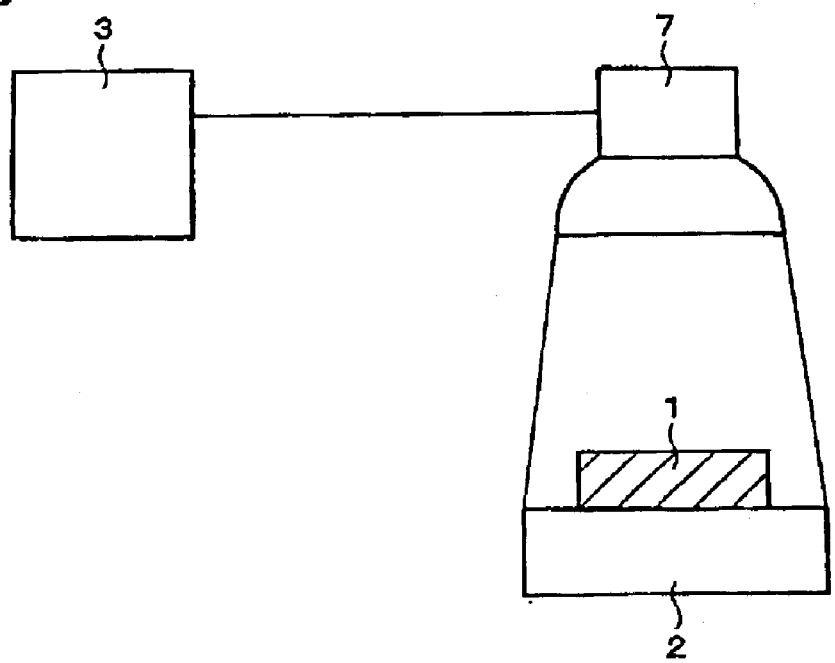
FIG. 2B is a view schematically showing a lamp irradiation apparatus used in the manufacturing steps of a ferroelectric memory according to the first embodiment of the present invention.

FIG. 2B is a view schematically showing an example of a lamp irradiation apparatus. In this lamp irradiation apparatus, lamp light output from a lamp 7 can be applied to the target 1 placed on the stage 2. The lamp 7 is controlled by the control device 3 so that pulsed light can be applied to the target 1 by repeatedly outputting lamp light a predetermined intervals.

1-1. EXAMPLE 1

In Example 1, the film formation step is described with reference to FIGS. 3A to 3D.

Figure 3A:
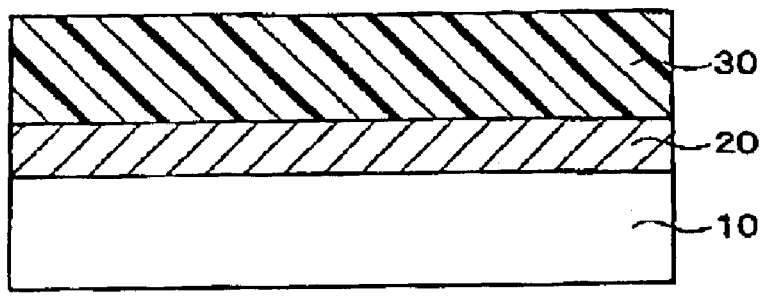
FIGS. 3A to 3D are views schematically showing formation steps of a ferroelectric film according to Examples 1 to 4 in the first embodiment of the present invention.
Figure 3B:
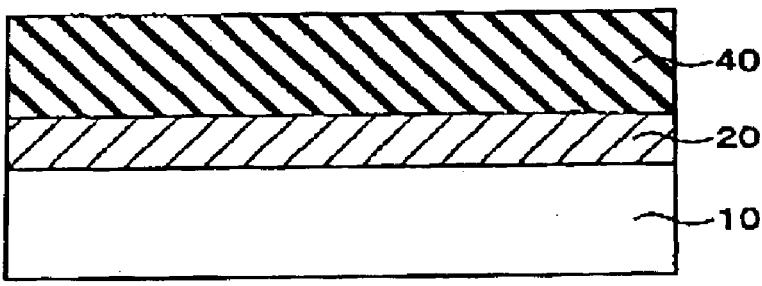
Figure 3C:
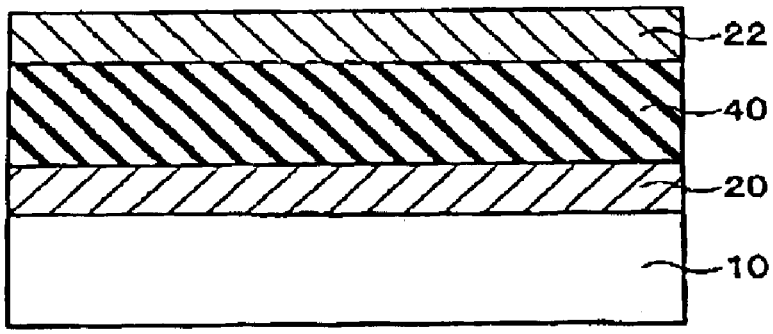
Figure 3D:
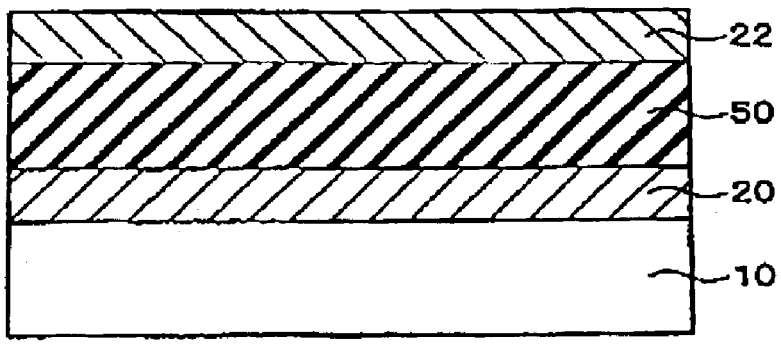

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, lamp light was applied to the oxide film 30 by causing a xenon lamp to emit light 10 times at a pulse width of 1 ms and an intensity of 10 $\mu J/cm^2$ to form the microcrystalline nuclei 40 of oxide. As shown in FIG. 3C, the upper electrode 22 was formed over the film including the microcrystalline nuclei 40 as a light transmission and/or absorption film formed of an oxide conductor. As shown in FIG. 3D, the oxide was crystallized by applying lamp light from above the upper electrode 22 by causing a xenon lamp to emit light 10 times at an intensity of 20 $\mu J/cm^2$ to form the SBT ferroelectric film 50 having a layered perovskite crystal structure.

1-2. EXAMPLE 2

In Example 2, the film formation step is described with reference to FIGS. 3A to 3D.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 $mJ/cm^2$ to form the microcrystalline nuclei 40 of oxide. As shown in FIG. 3C, the upper electrode 22 was formed over the film including the microcrystalline nuclei 40 as a light transmission and/or absorption film formed of an oxide conductor. As shown in FIG. 3D, the oxide was crystallized by applying laser light from above the upper electrode 22 by causing an excimer laser (wavelength: 248 nm) to scan 200 times at an intensity of 200 $mJ/cm^2$ to form the SBT ferroelectric film 50 having a layered perovskite crystal structure.

1-3. EXAMPLE 3

In Example 3, the film formation step is described with reference to FIGS. 3A to 3D.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 mJ/cm$^2$ to form the microcrystalline nuclei 40 of oxide. As shown in FIG. 3C, the upper electrode 22 was formed over the film including the microcrystalline nuclei 40 as a light transmission and/or absorption film formed of an oxide conductor. As shown in FIG. 3D, the oxide was crystallized by applying lamp light from above the upper electrode 22 by causing a xenon lamp to emit light 10 times at a pulse width of 1 ms and an intensity of 20 $\mu$J/cm$^2$ to form the SBT ferroelectric film 50 having a layered perovskite crystal structure.

1-4. EXAMPLE 4

In Example 4, the film formation step is described with reference to FIGS. 3A to 3D.

A solution in which strontium 2-ethylhexanoate, bismuth 2-ethylhexanoate, and tantalum 2-ethylhexanoate as raw materials for the oxide film 30 which becomes a ferroelectric film were dissolved in n-octane and n-butyl acetate as solvents was used. As shown in FIG. 3A, the solution was applied by using a spin coating method or the like and dried at 160° C. for 90 seconds and at 260° C. for 4 minutes to form the amorphous oxide film 30. As shown in FIG. 3B, laser light was applied to the oxide film 30 by causing an excimer laser (wavelength: 248 nm) to scan 100 times at an intensity of 50 mJ/cm$^2$ to form the microcrystalline nuclei 40 of oxide. As shown in FIG. 3C, the upper electrode 22 was formed over the film including the microcrystalline nuclei 40 as a light transmission and/or absorption film formed of an oxide conductor. As shown in FIG. 3D, the oxide was crystallized by applying lamp light from above the upper electrode 22 by causing a xenon lamp to emit light 10 times at a pulse width of 1 ms and an intensity of 20 $\mu$J/cm$^2$ to form the SBT ferroelectric film 50 having a layered perovskite crystal structure.

1-5. EFFECT OF EXAMPLES 1 to 4

According to the film formation step in Examples 1 to 4, the film can be heated in a short period of time by applying pulsed laser light or pulsed lamp light capable of instantaneously providing high energy. Therefore, thermal load applied to a portion other than the portion in which the oxide crystallizes, such as the lower electrode 20, can be reduced. Moreover, impurities can be removed by applying pulsed laser light or pulsed lamp light before crystallizing the oxide. Furthermore, the oxide is prevented from being vaporized or sublimated due to thermal energy of laser light or lamp light applied for crystallization by forming the upper electrode 22 as the light transmission and/or absorption film before crystallizing the oxide. Therefore, the high-quality ferroelectric film 50 can be formed without causing strain due to lattice displacement to occur in the ferroelectric crystals.

1-6. EXAMPLE 5

In Example 5, the film formation step is described with reference to FIGS. 4A to 4D.

Figure 4A:
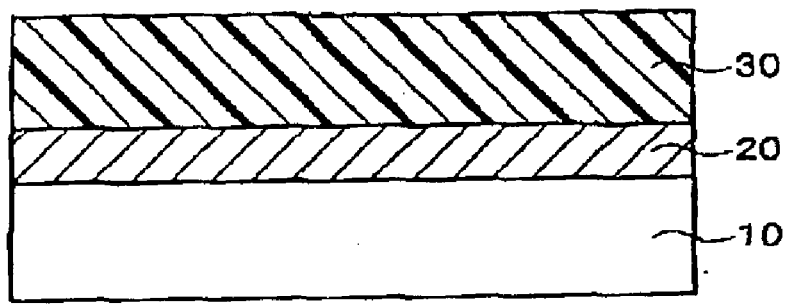
FIGS. 4A to 4D are views schematically showing formation steps of a ferroelectric film according to Example 5 in the first embodiment of the present invention.
Figure 4B:
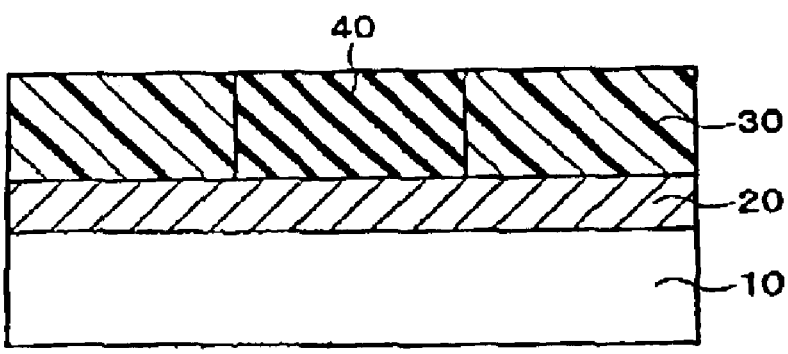
Figure 4C:
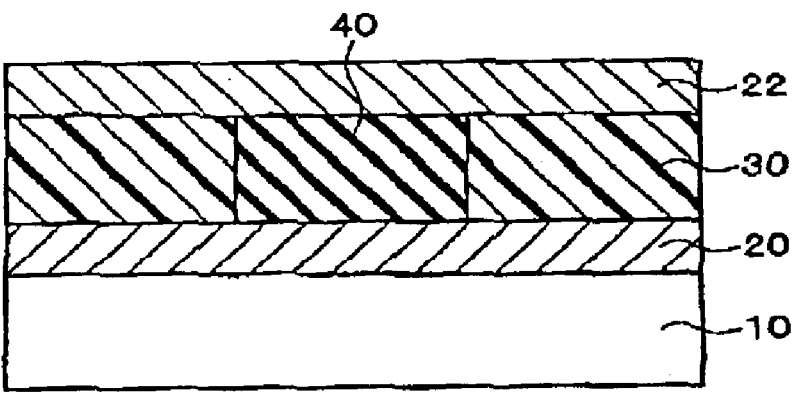
Figure 4D:
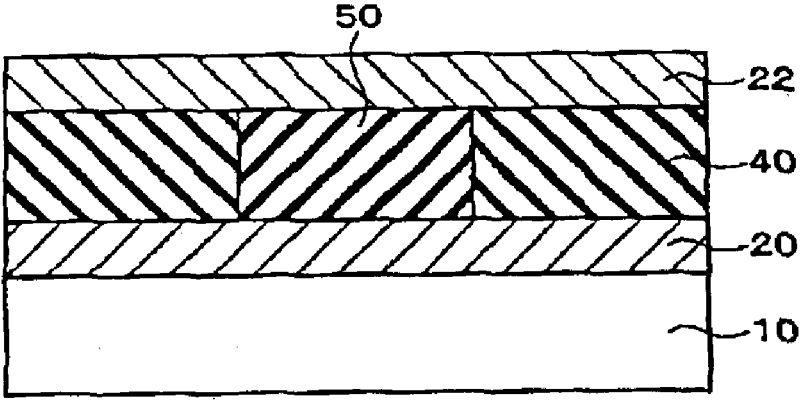

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 4A, the solution was applied by using a spin coating method or the like and dried at 160° C. for 90 seconds and at 400° C. for 60 seconds to form the amorphous oxide film 30. As shown in FIG. 4B, laser light was applied to the oxide film 30 only in a portion in which the ferroelectric capacitor 100 is formed by causing an excimer laser (wavelength: 248 nm) to scan 50 times at an intensity of 50 mJ/cm$^2$ to form the microcrystalline nuclei 40 of oxide. As shown in FIG. 4C, the upper electrode 22 was formed over the film including the microcrystalline nuclei 40 as a light transmission and/or absorption film formed of an oxide conductor. As shown in FIG. 4D, lamp light was applied to the entire surface of the film from above the upper electrode 22 by causing a xenon lamp to emit light 10 times at a pulse width of 1 ms and an intensity of 15 $\mu$J/cm$^2$. As a result, only the portion in which laser light and lamp light were applied was crystallized to obtain the PZT ferroelectric film 50 having a perovskite crystal structure.

1-7. EXAMPLE 6

In Example 6, the film formation step is described with reference to FIGS. 5A to 5D.

Figure 5A:
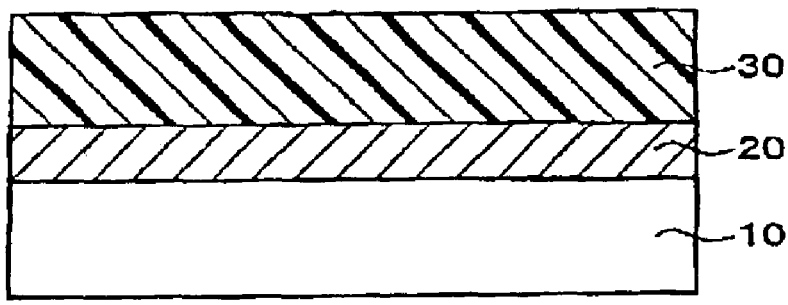
FIGS. 5A to 5D are views schematically showing formation steps of a ferroelectric film according to Example 6 in the first embodiment of the present invention.
Figure 5B:
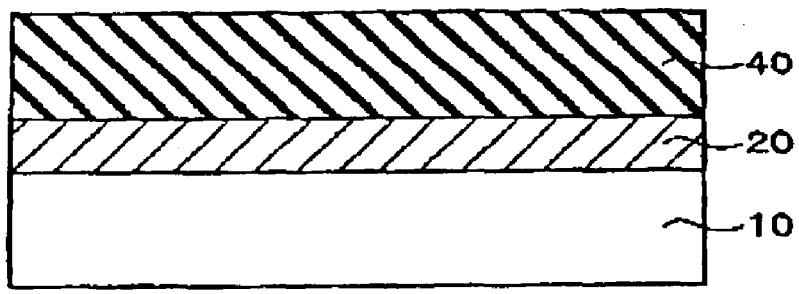
Figure 5C:
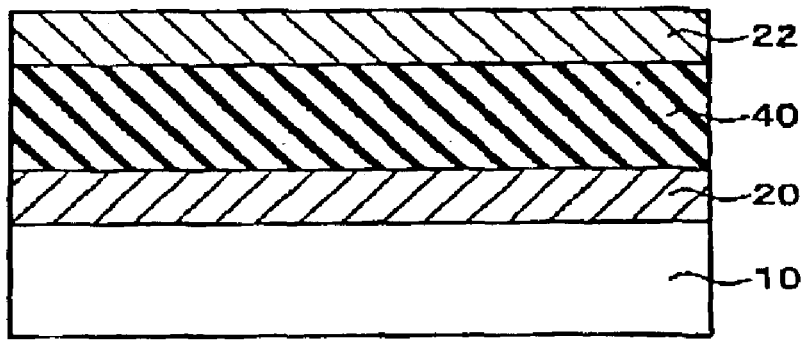
Figure 5D:
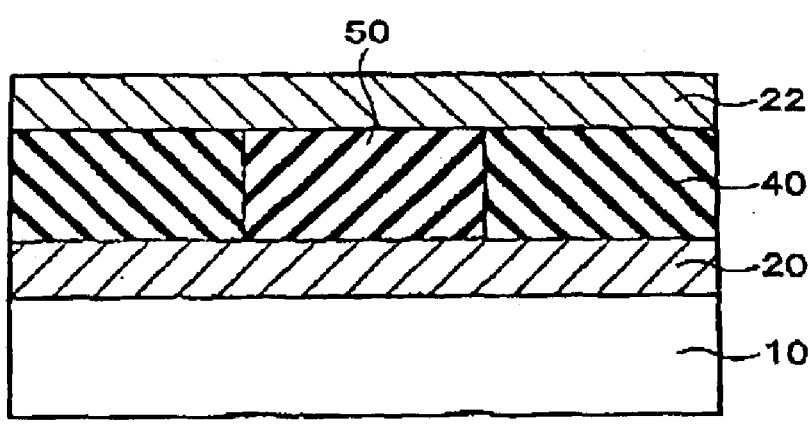

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 5A, the solution was applied by using a spin coating method or the like and dried at 160° C. for 90 seconds and at 400° C. for 60 seconds to form the amorphous oxide film 30. As shown in FIG. 5B, lamp light was applied to the entire surface of the oxide film 30 by causing a xenon lamp to emit light 10 times at a pulse width of 1 ms and an intensity of 10 $\mu$J/cm$^2$ to form the microcrystalline nuclei 40 of oxide. As shown in FIG. 5C, the upper electrode 22 was formed over the film including the microcrystalline nuclei 40 as a light transmission and/or absorption film formed of an oxide conductor. As shown in FIG. 5D, laser light was applied only to a portion in which the ferroelectric capacitor 100 is formed from above the upper electrode 22 by causing an excimer laser (wavelength: 248 nm) to scan 200 times at an intensity of 150 mJ/cm$^2$. As a result, only the portion in which laser light and lamp light were applied was crystallized to obtain the PZT ferroelectric film 50 having a perovskite crystal structure.

1-8. EFFECT OF EXAMPLES 5 AND 6

According to the film formation step in Examples 5 and 6, effects the same as those in Examples 1 to 4 can be obtained. Moreover, according to the film formation step in Examples 5 and 6, since only the portion in which lamp light and laser light are applied is crystallized by applying pulsed laser light only to a predetermined portion of the film, thermal load applied to a portion other than the predetermined portion such as the lower electrode 20 can be further reduced and only a desired area can be efficiently crystallized.

In Examples 5 and 6, the oxide film including the microcrystalline nuclei 40 in the portion other than the predetermined portion in which the oxide crystallizes may be used as a part of the insulating layer 23 of the ferroelectric memory 1000. According to this feature, damage to the ferroelectric film 50 can be reduced in the etching step for forming the ferroelectric capacitor 100, and the formation step of the insulating layer 23 can be simplified.

1-9. EXAMPLE 7

In Example 7, the film formation step is described with reference to FIGS. 6A to 6D.

Figure 6A:
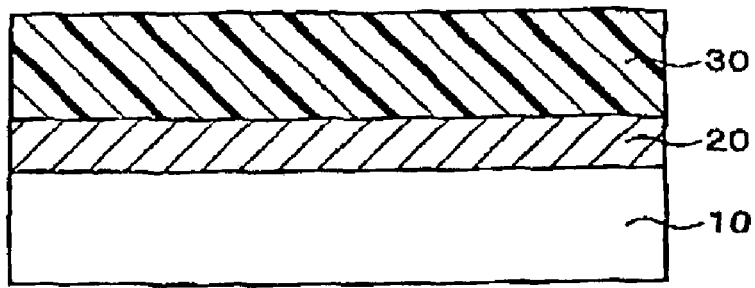
FIGS. 6A to 6D are views schematically showing formation steps of a ferroelectric film according to Example 7 in the first embodiment of the present invention.
Figure 6B:
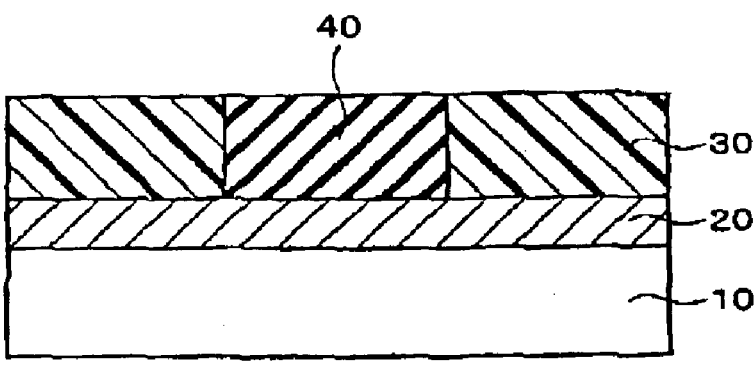
Figure 6C:
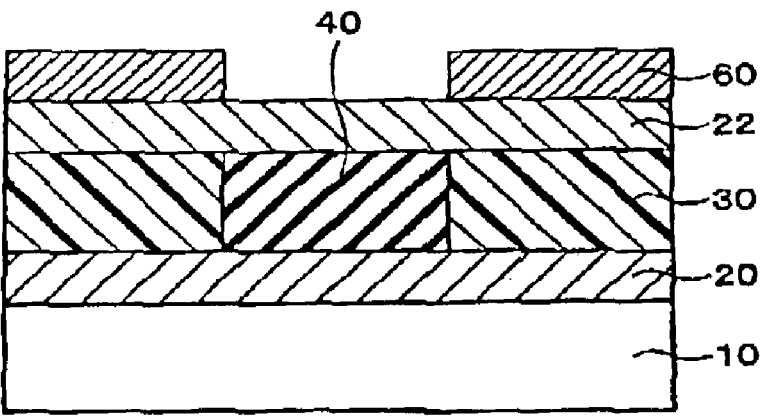
Figure 6D:
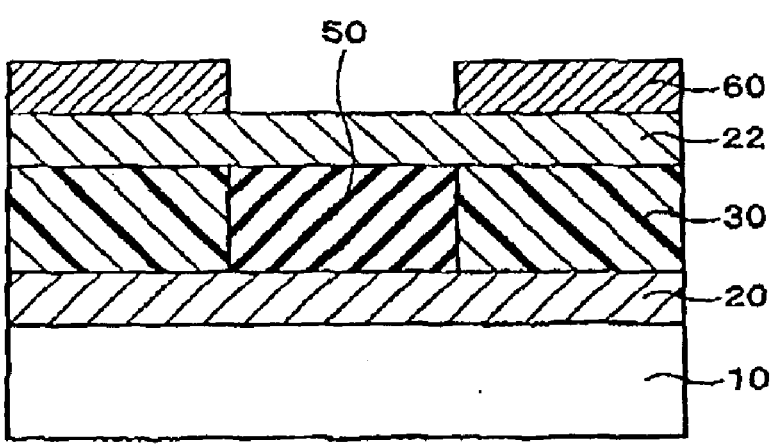

A solution in which Pb(CH$_3$COO)$_2$☐3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 6A, the solution was applied by using a spin coating method or the like and dried at 160° C. for 90 seconds and at 400° C. for 60 seconds to form the amorphous oxide film 30. As shown in FIG. 6B, laser light was applied to the oxide film 30 only in a portion in which the ferroelectric capacitor 100 is formed by causing an excimer laser (wavelength: 248 nm) to scan 50 times at an intensity of 50 mJ/cm$^2$ to form the microcrystalline nuclei 40 of oxide. As shown in FIG. 6C, the upper electrode 22 as a light transmission and/or absorption film formed of an oxide conductor, and a light blocking film 60 consisting of a metal such as Al, Au, Ag, Cu, Pt, or Ir were successively stacked over the oxide film 30. As shown in FIG. 6D, lamp light was applied to the entire surface of the film by causing a xenon lamp to emit light 10 times at a pulse width of 1 ms and an intensity of 15 $\mu$J/cm$^2$. The oxide film 30 under a light blocking film 60 remains amorphous, since light is not applied to the oxide film 30. As a result, only the portion in which laser light and lamp light were applied was crystallized to obtain the PZT ferroelectric film 50 having a perovskite crystal structure.

In the step of forming the upper electrode 22 and the light blocking film 60 in this example, the upper electrode 22 may be formed overly in a predetermined portion in which the microcrystalline nuclei 40 are formed, and the light blocking film 60 may be directly formed over the amorphous oxide film 30.

1-10. EXAMPLE 8

In Example 8, the film formation step is described with reference to FIGS. 7A to 7D.

Figure 7A:
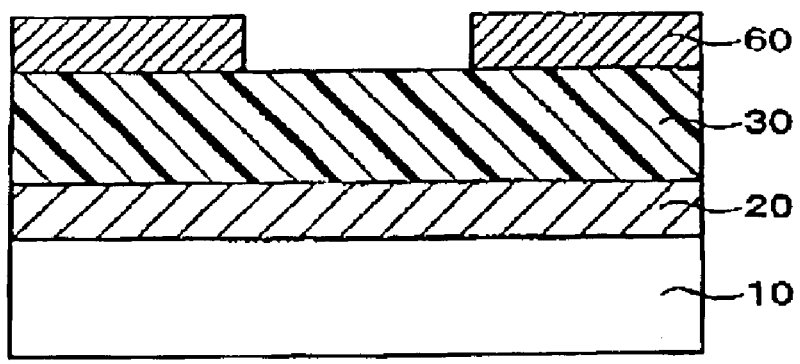
FIGS. 7A to 7D are views schematically showing formation steps of a ferroelectric film according to Example 8 in the first embodiment of the present invention.
Figure 7B:
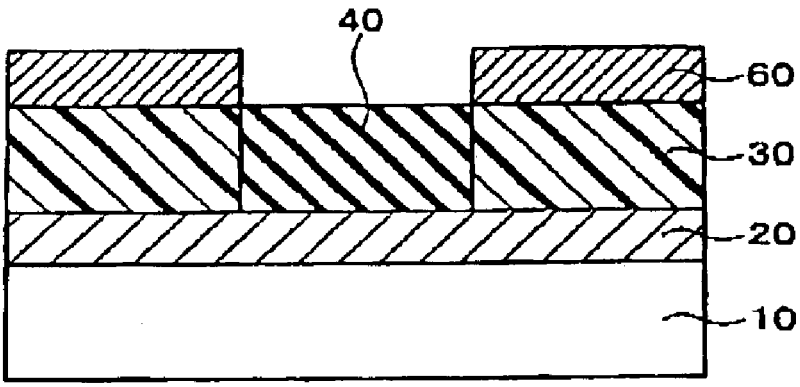
Figure 7C:
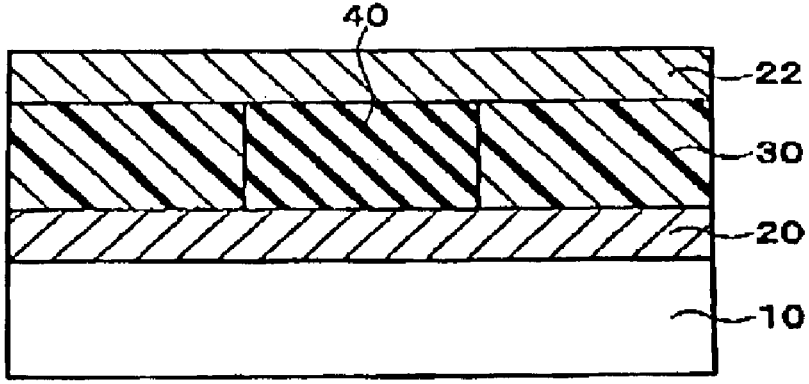
Figure 7D:
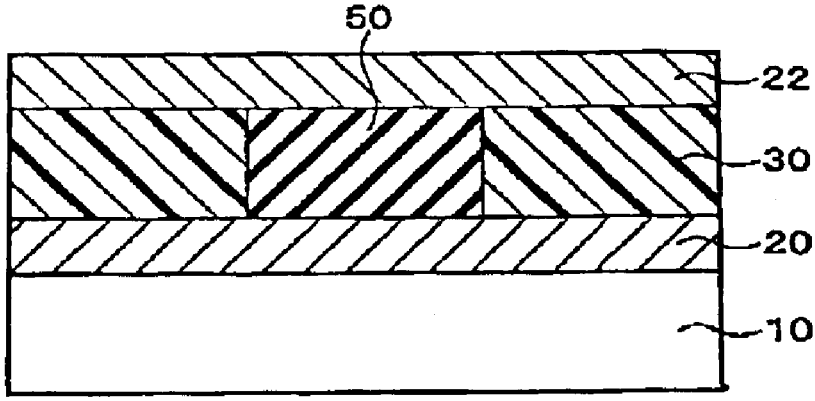

A solution in which Pb(CH$_3$COO)$_2$.3H$_2$O, Zr(n-OC$_4$H$_9$), and Ti(i-OC$_3$H$_7$)$_4$ as raw materials for the oxide film 30 which becomes a ferroelectric film were dissolved in 2-methoxyethanol as a solvent was used. As shown in FIG. 7A, the solution was applied by using a spin coating method or the like and dried at 160° C. for 90 seconds and at 400° C. for 60 seconds to form the amorphous oxide film 30. The light blocking film 60 consisting of a metal such as Al, Au, Ag, Cu, Pt, or Ir was then formed over the oxide film 30. As shown in FIG. 7B, lamp light was applied to the entire surface of the oxide film 30 by causing a xenon lamp to emit light 10 times at a pulse width of 1 ms and an intensity of 10 $\mu$J/cm$^2$ to form the microcrystalline nuclei 40 of oxide. The oxide film 30 under the light blocking film 60 remained amorphous since light was not applied. As shown in FIG. 7C, the light blocking film 60 was removed by etching or the like, and the upper electrode 22 was formed over the entire surface of the film as a light transmission and/or absorption film formed of an oxide conductor. As shown in FIG. 7D, laser light was applied only to a portion in which the ferroelectric capacitor 100 is formed from above the upper electrode 22 by causing an excimer laser (wavelength: 248 nm) to scan 200 times at an intensity of 150 mJ/cm$^2$. As a result, only the portion in which laser light and lamp light were applied was crystallized to obtain the PZT ferroelectric film 50 having a perovskite crystal structure.

In the step of forming the upper electrode 22 in this example, the light blocking film 60 formed over the amorphous oxide film 30 may not be removed, and the upper electrode 22 may be formed overly in a predetermined portion in which the microcrystalline nuclei 40 are formed.

1-11. EFFECT OF EXAMPLES 7 AND 8

According to the film formation step in Examples 7 and 8, effects the same as those in Examples 1 to 4 can be obtained. Moreover, according to the film formation step in Examples 7 and 8, since light is kept from being applied to a portion other than the portion in which the ferroelectric is crystallized by covering the portion other than the predetermined portion with the light blocking film 60, thermal load applied to a portion other than the predetermined portion such as the lower electrode 20 can be significantly reduced.

In Examples 7 and 8, the oxide film 30 in the portion other than the predetermined portion in which the oxide crystallizes may be used as a part of the insulating layer 23 of the ferroelectric memory 1000 in the same manner as in Examples 5 and 6. According to this feature, damage to the ferroelectric film 50 can be reduced in the etching step for forming the ferroelectric capacitor 100, and the formation step of the insulating layer 23 can be simplified.

1-12. ANOTHER EXAMPLE

The film formation step in the present embodiment may be carried out according to a feature other than those illustrated in Examples 1 to 8.

In Examples 1 to 8, if the lower electrode 20 is formed over the substrate 10 by using a material which reflects laser light or lamp light (metal such as Ir and Pt), light which is transmitted through the oxide film 30 (oxide film including the microcrystalline nuclei 40) during irradiation can be reflected by a light reflection film and utilized for the heat treatment. According to this feature, a ferroelectric can be efficiently crystallized in a shorter period of time. In the case where the lower electrode 20 is not used as a light reflection film, a light reflection film may be separately formed under the oxide film 30.

The intensity of light applied to the amorphous oxide film 30 may be set to be equal to or lower than the intensity of light applied for crystallizing the oxide, for example. Therefore, the intensity of light applied in a plurality of stages is not limited to that illustrated in Examples 1 to 8, and may be appropriately set depending on the crystallizing temperature of the ferroelectric material.

The number of pulses (number of irradiations) of light applied to the amorphous oxide film 30 may be set to be equal to or lower than the number of pulses (number of irradiations) of light applied for crystallizing the oxide, for example. Therefore, the number of pulses of light applied in a plurality of stages is not limited to that illustrated in Examples 1 to 8, and may be appropriately set depending on the crystallization state of the ferroelectric material.

Examples 1 to 4 illustrate the case of forming the SBT ferroelectric film and Examples 5 to 8 illustrate the case of forming the PZT ferroelectric film. However, an arbitrary ferroelectric film may be formed by using a conventional ferroelectric material in the film formation step by using the method illustrated in each example. As examples of ferroelectric materials other than those illustrated above, a material in which a metal such as niobium, nickel, or magnesium is added to PZT or SBT can be given. As specific examples of other ferroelectric materials, lead titanate (PbTiO$_3$), lead zirconate (PbZrO$_3$), lead lanthanum titanate ((Pb,La),TiO$_3$), lead lanthanum zirconate titanate ((Pb,La)(Zr,Ti)O$_3$), lead magnesium niobate zirconium titanate (Pb(Zr,Ti)(Mg,Nb)O$_3$), and the like may be used.

As the method of forming the oxide film 30 in the above examples, a conventional deposition method such as a spin coating method or a dipping method using a sol-gel material or an MOD material, a sputtering method, an MOCVD method, or a laser ablation method may be used.

In the above examples, there are no predetermined limitations to the material and the deposition method for the lower electrode 20. Any conventional material and deposition method may be used. As examples of the electrode material, Ir, $IrO_x$, Pt, Ru, $RuO_x$, $SrRuO_x$, $LaSrCoO_x$, and the like can be given. As examples of the method of depositing the electrode film, a vapor-phase method, liquid-phase method, and the like can be given.

According to the method of manufacturing the ferroelectric memory 1000 in the present embodiment, thermal load applied in the step of forming the ferroelectric film 50 can be reduced. Moreover, according to the method of manufacturing the ferroelectric memory 1000 in the present embodiment, the oxide to be crystallized can be prevented from being vaporized or sublimated. Therefore, characteristics and yield of the resulting device can be improved, whereby productivity can be increased.

2. Second Embodiment

FIGS. 8A to 8D are views schematically showing an example of manufacturing steps of a ferroelectric memory 1100 according to the second embodiment of the present invention. Sections having substantially the same functions as the sections shown in FIGS. 1A to 1D are indicated by the same symbols. Detailed description of these sections is omitted.

Figure 8A:
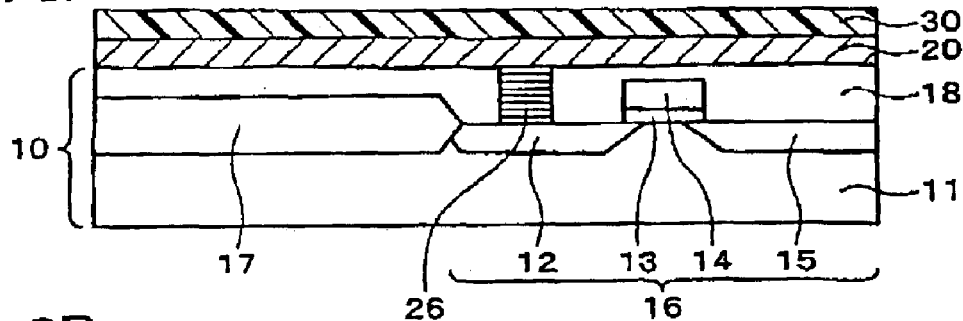
FIGS. 8A to 8D are views schematically showing manufacturing steps of a ferroelectric memory according to the second embodiment of the present invention.

As shown in FIG. 8A, the lower electrode 20 and the oxide film 30 formed of a ferroelectric material are successively stacked over the base 10 in which the transistor 16 and a plug electrode 26 are formed over the substrate 11.

Figure 8B:
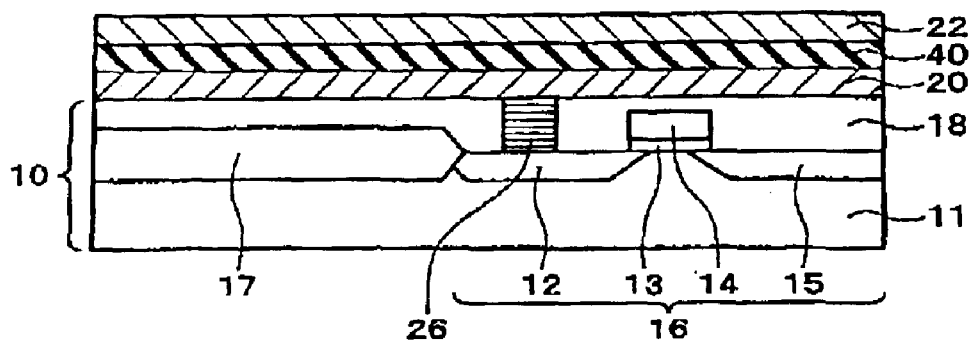

As shown in FIG. 8B, the microcrystalline nuclei 40 of oxide are formed by applying pulsed laser light or pulsed lamp light to the amorphous oxide film 30. Thereafter, the upper electrode 22 is formed of an oxide conductor over the ferroelectric film 50 as a light transmission and/or absorption film. The upper electrode 22 is formed over the film including the microcrystalline nuclei 40.

Figure 8C:
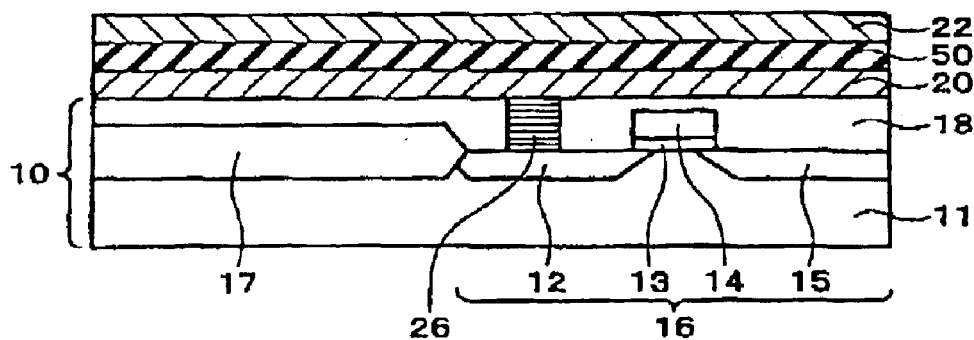

As shown in FIG. 8C, the ferroelectric film (ferroelectric layer) 50 is formed by crystallizing the oxide by applying pulsed laser light or pulsed lamp light from above the upper electrode 22. In the film formation step shown in FIGS. 8A to 8C, a portion in which the ferroelectric film 50 is formed by crystallizing the oxide may be either the entire oxide film 30 or only a desired area of the oxide film 30 taking an etching step as described later into consideration. In the film formation step, the ferroelectric film 50 crystallized based on the example described in the first embodiment can be formed.

Figure 8D:
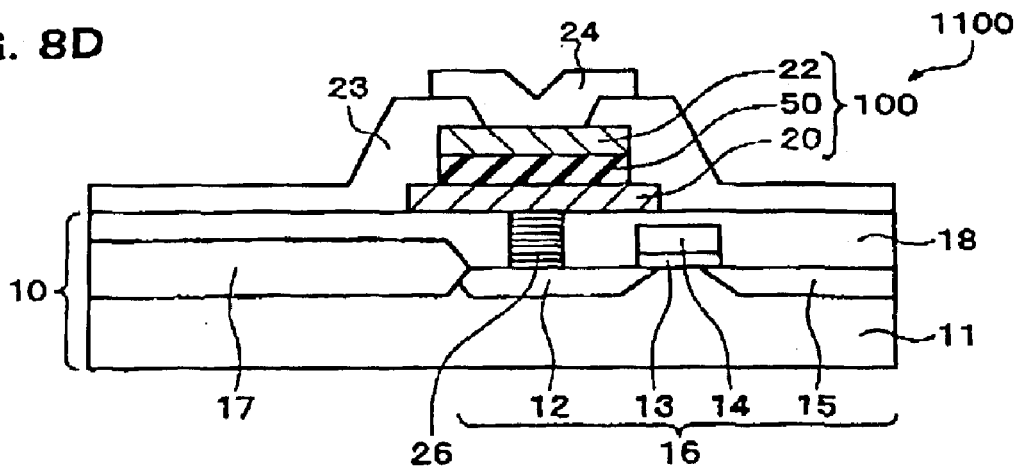

As shown in FIG. 8D, the lower electrode 20, the ferroelectric film 50, and the upper electrode 22 are etched to form the ferroelectric capacitor 100. The ferroelectric capacitor 100 is connected with the transistor 16 through the plug electrode 26. After forming the insulating layer 23 over the ferroelectric capacitor 100, the interconnection layer 24 for connecting with the outside is formed to obtain the ferroelectric memory 1100.

According to the method of manufacturing the ferroelectric memory 1100 in the present embodiment, thermal load applied in the step of forming the ferroelectric film 50 can be reduced. Moreover, according to the method of manufacturing the ferroelectric memory 1100 in the present embodiment, the oxide to be crystallized can be prevented from being vaporized or sublimated. Therefore, characteristics and yield of the resulting device can be improved, whereby productivity can be increased.

The crystallization step of the oxide shown in FIG. 8C may be performed after the etching step. In this case, the oxide film in which the microcrystalline nuclei 40 are formed, the upper electrode 20, and the lower electrode 22 are etched into a predetermined shape before forming the ferroelectric film 50 by crystallizing the oxide. It suffices that at least the oxide film be etched. The oxide can be crystallized while restoring etching damage to the oxide film by applying pulsed laser light or pulsed lamp light to the oxide film through the upper electrode 22.

3. Third Embodiment

Figure 9A:
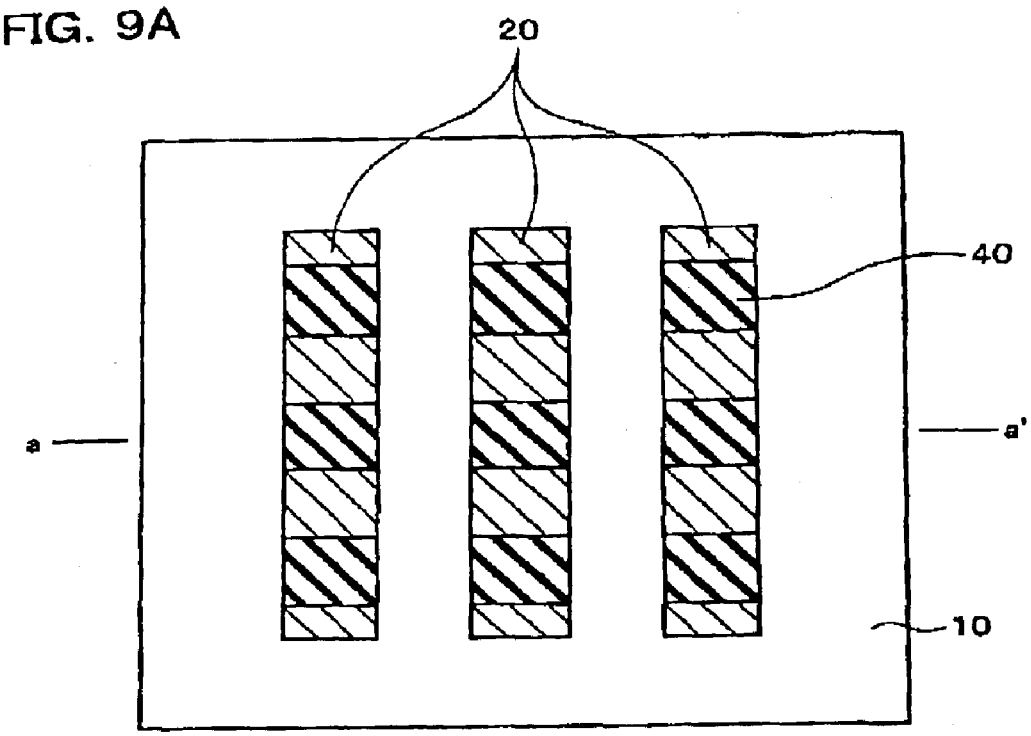
FIG. 9A is a view schematically showing a manufacturing step of a ferroelectric memory cell according to the third embodiment of the present invention.
Figure 9B:
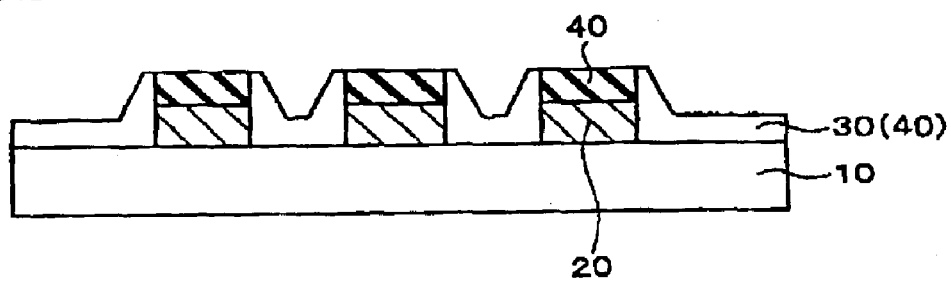
FIG. 9B is a cross-sectional view along the line a–a' shown in FIG. 9A.
Figure 10A:
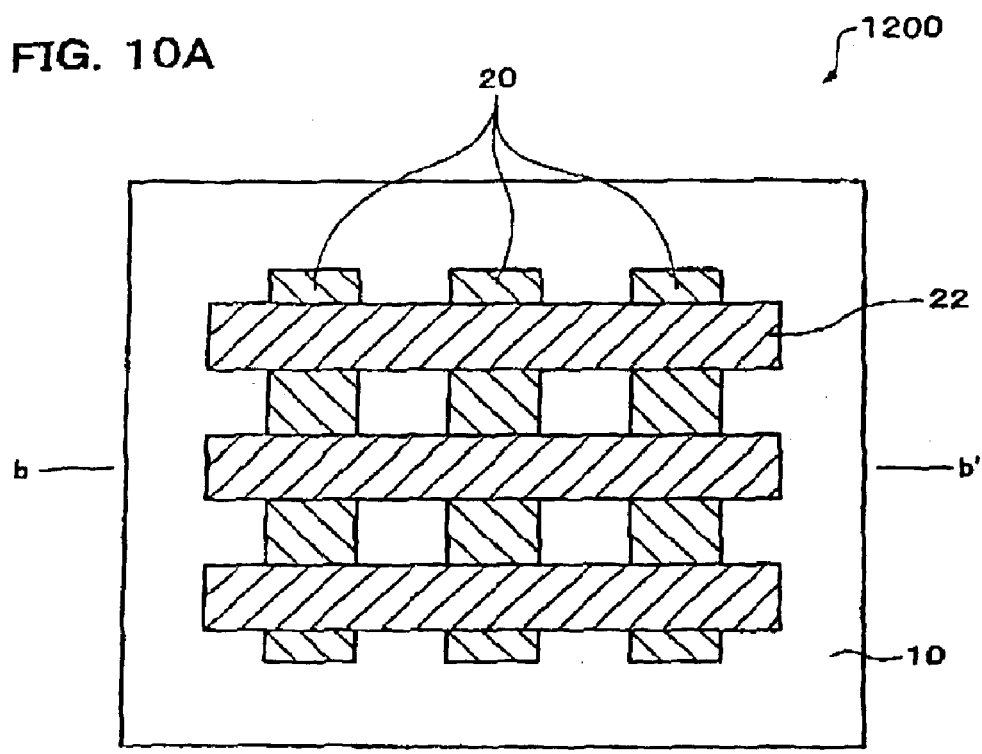
FIG. 10A is a view schematically showing a manufacturing step of a ferroelectric memory cell according to the third embodiment of the present invention.

FIGS. 9A, 9B, 10A, and 10B are views schematically showing an example of manufacturing steps of a ferroelectric memory cell array 1200 according to the third embodiment of the present invention. The ferroelectric memory cell array 1200 makes up a ferroelectric memory device in combination with peripheral circuits for selecting and driving each memory cell. Since a conventional structure and manufacturing method can be applied to the peripheral circuits, illustration and detailed description of the peripheral circuits are omitted. Sections having the same functions as the sections described in the first and second embodiments are indicated by the same symbols. Detailed description of these sections is omitted. In FIGS. 9A and 10A, illustration of the uncrystallized oxide film 30 (or oxide film including the microcrystalline nuclei 40) is omitted for convenience of description.

In the method of manufacturing the ferroelectric memory cell array 1200 according to the present embodiment, a plurality of stripe-shaped lower electrodes 20 are formed over the substrate 10, as shown in FIGS. 9A and 9B. As shown in FIGS. 9A and 9B, the oxide film 30 is formed over the lower electrodes 20 by using the film formation step according to the example described in the first embodiment. Laser light is applied only to a predetermined portion of the oxide film 30 to form the microcrystalline nuclei 40 of oxide. The microcrystalline nuclei 40 of oxide may be formed in the entire film by applying laser light or lamp light to the entire oxide film 30.

Figure 10B:
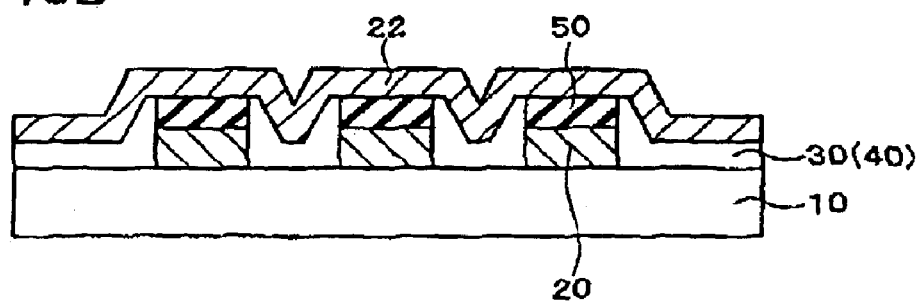
FIG. 10B is a cross-sectional view along the line b–b' shown in FIG. 10A.

As shown in FIGS. 10A and 10B, a plurality of stripe-shaped upper electrodes 22 are formed over at least a predetermined portion of the film including the microcrystalline nuclei 40 of oxide so as to intersect the lower electrodes 20 at right angles. The upper electrode 22 may be formed of an oxide conductor which at least either transmits or absorbs light. The oxide crystallizes by applying laser light or lamp light from above the upper electrode 22 to form the ferroelectric film (ferroelectric layer) 50 at least in the portion in which the lower electrode 20 intersects the upper electrode 22.

The ferroelectric memory cell array 1200 in which the ferroelectric film 50 is interposed between the lower electrodes 20 and the upper electrodes 22 can be formed by these steps. The amorphous oxide film 30 which is not crystallized in the formation step of the ferroelectric film (or oxide film including the microcrystalline nuclei 40) may be used as an insulating film for insulating the electrodes from one another. This configuration enables the etching step of the ferroelectric film 50 and the formation step of the insulating film to be omitted, whereby the manufacturing process can be simplified.

According to the method of manufacturing the ferroelectric memory cell array 1200 in the present embodiment, thermal load applied in the step of forming the ferroelectric film 50 can be reduced, and the oxide to be crystallized can be prevented from being vaporized or sublimated. Therefore, characteristics and yield of the resulting device can be improved, whereby productivity can be increased.

The insulating film for insulating the electrodes from one another may be provided separately. In this case, an etching step is necessary. Therefore, at least the oxide film after forming the microcrystalline nuclei 40 is etched into a predetermined shape before forming the ferroelectric film 50 by crystallizing the oxide. The oxide can be crystallized by applying pulsed laser light or pulsed lamp light to the oxide film through the upper electrode 22 while restoring etching damage to the oxide film. If the insulating film is formed after completing the crystallization step, the high-quality ferroelectric film 50 can be obtained.

4. Fourth Embodiment

Figure 11:
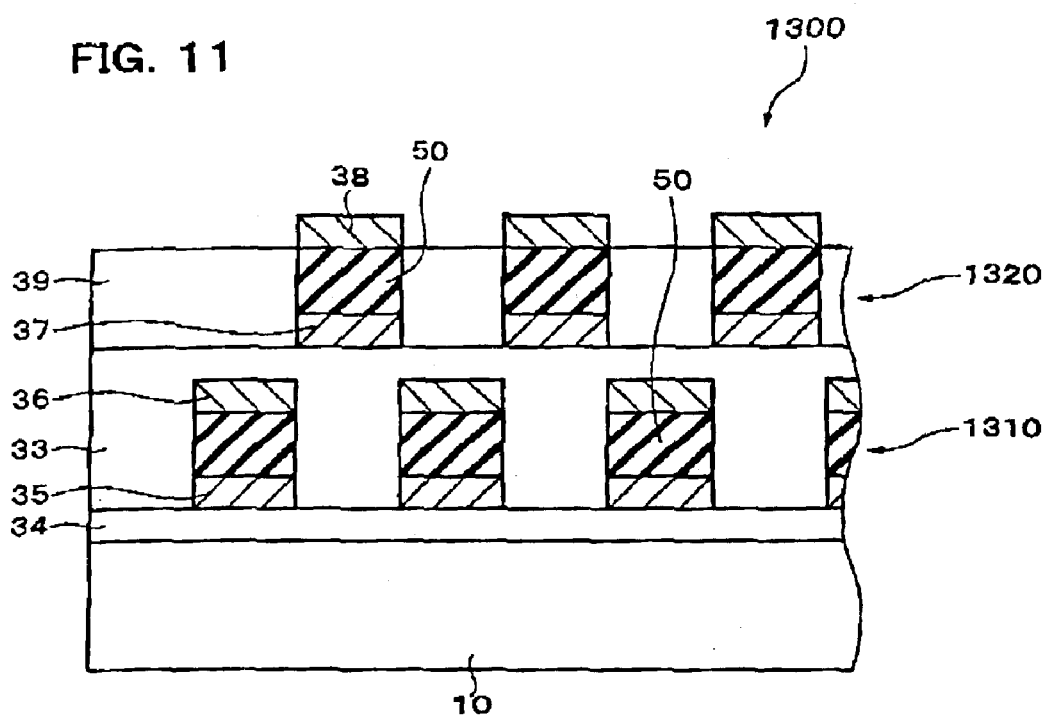
FIG. 11 is a cross-sectional view schematically showing a ferroelectric memory cell array according to the fourth embodiment of the present invention.

FIG. 11 is a cross-sectional view schematically showing a ferroelectric memory 1300 according to the fourth embodiment of the present invention. Sections having the same functions as the sections described in the first, second, and third embodiments are indicated by the same symbols. Detailed description of these sections is omitted. The ferroelectric memory 1300 has a structure in which ferroelectric memory cell arrays 1310 and 1320 shown in FIG. 12A and FIG. 12B, in which ferroelectric memory cells are disposed in the shape of a matrix, are stacked as a basic configuration. Each of the ferroelectric memory cell arrays 1310 and 1320 has the same structure as that of the ferroelectric memory cell array 1200 according to the third embodiment. The ferroelectric memory 1300 also includes a peripheral circuit section which selects and drives the ferroelectric memory cell arrays 1310 and 1320. Since a conventional structure and manufacturing method can be applied to the peripheral circuit section, illustration and detailed description of the peripheral circuit section are omitted.

The ferroelectric memory 1300 has a novel structure in which lower electrodes 35 (or 37) and upper electrodes 36 (or 38) of the ferroelectric memory cell arrays 1310 and 1320 are disposed so that the intersecting portions of the electrodes do not overlap in the adjacent ferroelectric memory cell arrays 1310 and 1320. The ferroelectric memory 1300 may be formed by forming the ferroelectric memory cell arrays 1310 and 1320 by using the method described in the third embodiment and successively stacking the ferroelectric memory cell arrays 1310 and 1320. However, the ferroelectric memory 1300 may be formed by using a manufacturing method described below.

An example of another manufacturing method of the ferroelectric memory 1300 is described below with reference to FIGS. 11, 12A, and 12B.

Figure 12A:
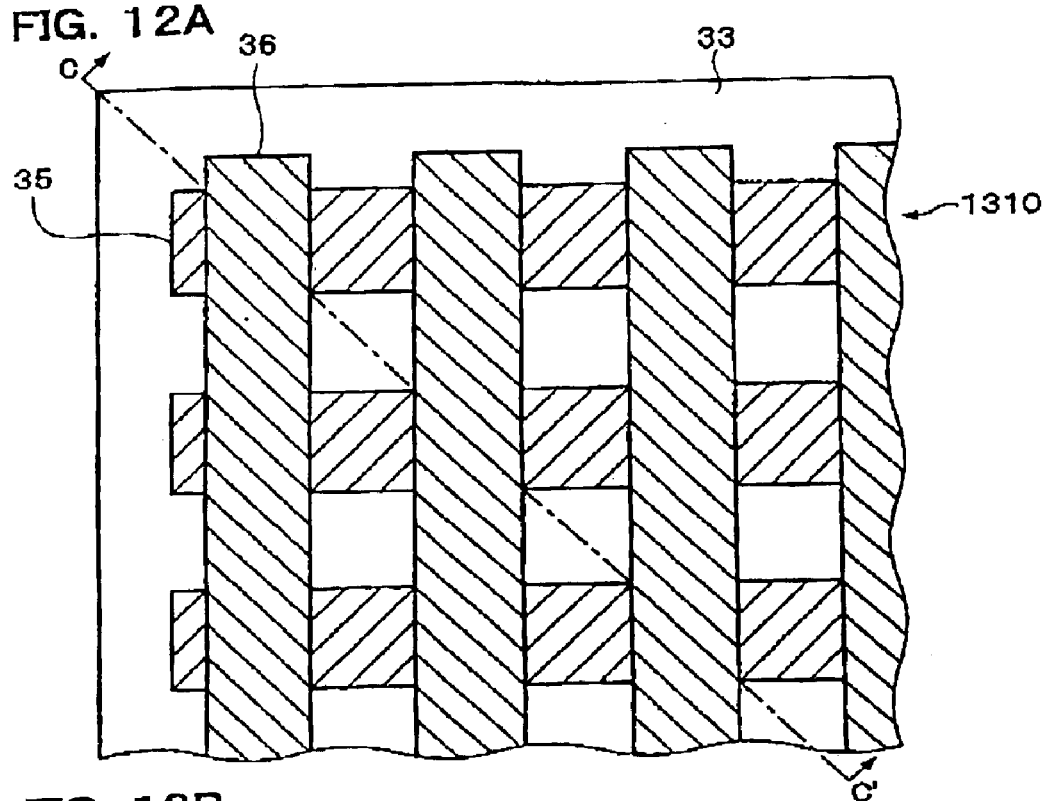
FIGS. 12A and 12B are views schematically showing a manufacturing step of a ferroelectric memory cell array according to the fourth embodiment of the present invention.
Figure 12B:
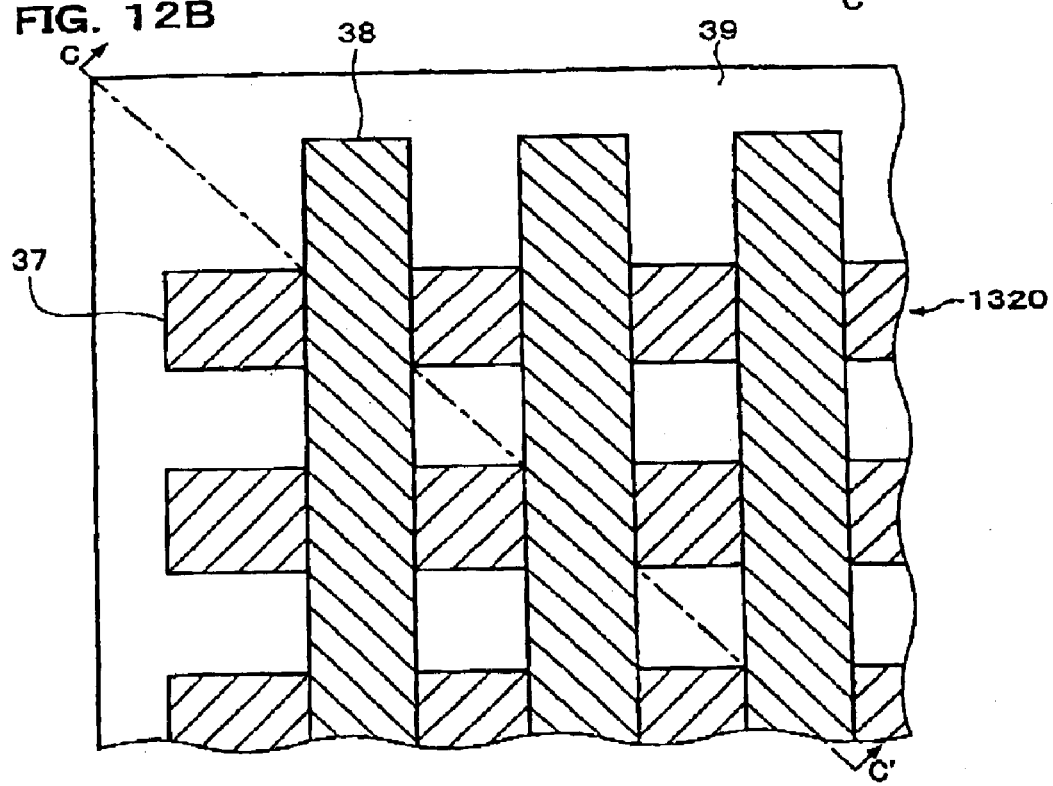

As shown in FIGS. 11 and 12A, the lower electrodes 35 and an amorphous oxide film (not shown) are formed over the base 10 through an insulating film 34. Microcrystalline oxide nuclei (not shown) are formed at least in a portion in which the lower electrode 35 intersects the upper electrode 36 as described later by using the method described in the example in the first embodiment. The insulating film 34 formed over the base 10 is not an essential component and may be provided optionally.

The upper electrodes 36 are formed over the film including the microcrystalline nuclei as a light transmission and/or absorption film formed of an oxide conductor. An interlayer dielectric 33 is formed of $SiO_2$ or the like over the entire film. The interlayer dielectric 33 may be formed by using a material which transmits light. The ferroelectric memory cell array 1310 is formed in this manner. In this stage, the oxide is not crystallized in the intersecting portions of the lower electrodes 35 and the upper electrodes 36.

The ferroelectric memory cell array 1320 is formed over the ferroelectric memory cell array 1310 by using the same method as described above. An interlayer dielectric 39 may be formed over the ferroelectric memory cell array 1320 by using a material which transmits light. When forming the ferroelectric memory cell array 1320, the lower electrodes 37 and the upper electrodes 38 are formed so that the intersecting portions of the lower electrodes 35 and the upper electrodes 36 of the ferroelectric memory cell array 1310 do not overlap the intersecting portions of the lower electrodes 37 and the upper electrodes 38 of the ferroelectric memory cell array 1320.

The oxide disposed in the intersecting portions of the electrodes of the ferroelectric memory cell arrays 1310 and 1320 is crystallized by applying pulsed laser light or pulsed lamp light from above the ferroelectric memory 1300 to form the ferroelectric film (ferroelectric layer) 50.

The intersecting portions of the electrodes of the ferroelectric memory cell arrays 1310 and 1320 are disposed so as not to overlap each other. Therefore, in the intersecting portions of the electrodes of the ferroelectric memory cell array 1320, the oxide crystallizes by applying light through the upper electrodes 38. In the intersecting portions of the electrodes of the ferroelectric memory cell array 1310, the oxide crystallizes by applying light through the interlayer dielectrics 33 and 39 and the upper electrodes 36.

Therefore, according to the method of manufacturing the ferroelectric memory 1300 in the present embodiment, a ferroelectric memory having good characteristics can be obtained by preventing the oxide which is the ferroelectric material from being vaporized or sublimated. Moreover, according to the method of manufacturing the ferroelectric memory 1300, since the oxide can be crystallized at the same time in a state in which the plurality of ferroelectric memory cell arrays 1310 and 1320 are stacked, the manufacturing process can be simplified, whereby production efficiency can be increased.

The present embodiment illustrates the case where two ferroelectric memory cell arrays are stacked. However, the present invention is not limited thereto. For example, three or more ferroelectric memory cell arrays may be stacked. In the case where three or more ferroelectric memory cell arrays are stacked, the ferroelectric films (ferroelectric layers) 50 of at least two ferroelectric memory cell arrays can be formed by using the above manufacturing method.

There may be a case where an etching step is necessary when forming the interlayer dielectrics 33 and 39 for insulating the ferroelectric memory cell arrays 1310 and 1320 from the other. In this case, at least the oxide film after forming the microcrystalline nuclei is etched corresponding to the shape of the intersecting portions of the electrodes before forming the ferroelectric film 50 by crystallizing the oxide. The oxide can be crystallized while restoring etching damage to the oxide film by applying pulsed laser light or pulsed lamp light to the oxide film through the upper electrodes 36 and 38. If the interlayer dielectrics 33 and 39 are formed after completing the crystallization step, the high-quality ferroelectric film 50 can be obtained.

5. Fifth Embodiment

Figure 13A:
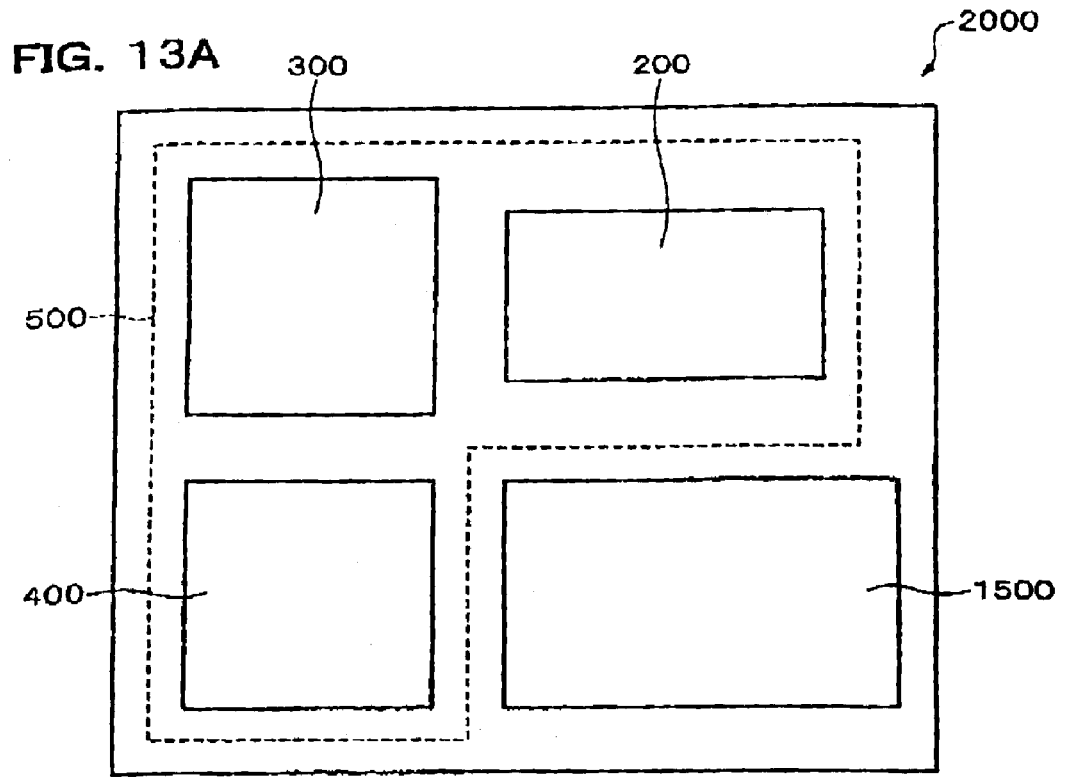
FIG. 13A is a view schematically showing a semiconductor device according to the fifth embodiment of the present invention.

FIG. 13A is a view schematically showing a semiconductor device 2000 according to the fifth embodiment of the present invention. In this semiconductor device, a memory cell region 1500 including ferroelectric capacitors and a circuit region 500 consisting of semiconductor circuits 200, 300, and 400 are formed over a single substrate. The memory cell region 1500 is made up of a plurality of ferroelectric memories 1000 and 1100 described in the first and second embodiments and the ferroelectric memory cell arrays 1200, 1310, and 1320 described in the third and fourth embodiments, for example. As examples of the semiconductor circuits 200, 300, and 400, a driver circuit and a calculation circuit for the memory cell region 1500, other memory devices, and the like can be given.

In the semiconductor device 2000 having such a structure, since a heat treatment is performed at a high temperature when forming the ferroelectric capacitors, if the circuit region 500 is formed over the substrate before the memory cell region 1500, a problem relating to deterioration of characteristics of each of the semiconductor circuits 200, 300, and 400 in the circuit region 500 occurs.

Figure 13B:
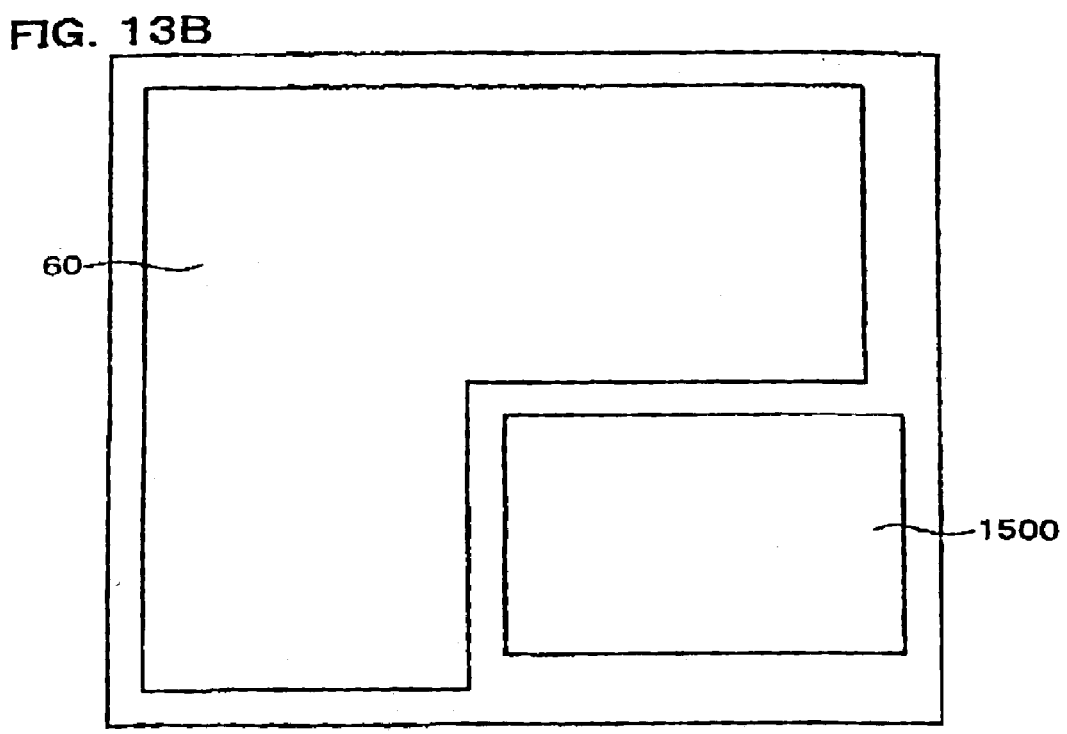
FIG. 13B is a view schematically showing a manufacturing step of the semiconductor device according to the fifth embodiment of the present invention.

Therefore, in the semiconductor device 2000 according to the present embodiment, the memory cell region 1500 is formed over the substrate after forming the circuit region 500 over the substrate and forming the light blocking film 60 consisting of a metal or the like over the circuit region 500, as shown in FIG. 13B. The ferroelectric capacitors included in the memory cell region 1500 may be formed by using the method of forming a ferroelectric film described in the example in the first embodiment.

In other words, laser light or lamp light applied for crystallizing the oxide does not affect the circuit region 500 under the light blocking film 60 due to the presence of the light blocking film 60. Therefore, according to the method of manufacturing the semiconductor device 2000 in the present embodiment, since thermal load applied to the circuit region 500 other than the memory cell region 1500 including the ferroelectric layer can be reduced by forming the light blocking film 60, the degrees of freedom of the manufacturing process are increased. Moreover, according to this manufacturing method, since thermal load applied to the circuit region 500 is reduced, metal interconnects and the like in the circuit do not deteriorate during heating, whereby characteristics of the semiconductor circuits 200, 300, and 400 can be secured and the yield of the semiconductor device 2000 can be improved.

The preferred embodiments of the present invention are described above. However, the present invention is not limited to these embodiments. Various modifications and variations are possible within the scope of the present invention.

What is claimed is:

1. A method of forming a ferroelectric film comprising:
   applying pulsed laser light or pulsed lamp light to an amorphous oxide film formed over a substrate to form microcrystalline nuclei of oxide in the oxide film,
   forming a light transmission and/or absorption film over the oxide film, and
   applying pulsed laser light or pulsed lamp light to the oxide film from above the light transmission and/or absorption film to crystallize the oxide, so that a ferroelectric film is formed.

2. A method of forming a ferroelectric film comprising:
   applying pulsed laser light only to a predetermined portion of an amorphous oxide film formed over a substrate to form microcrystalline nuclei of oxide in the oxide film,
   forming a light transmission and/or absorption film over the oxide film, and
   applying pulsed lamp light to the oxide film from above the light transmission and/or absorption film to crystallize the oxide in the predetermined portion, so that a ferroelectric film is formed.

3. A method of forming a ferroelectric film comprising:
   applying pulsed lamp light to an amorphous oxide film formed over a substrate to form microcrystalline nuclei of oxide in the oxide film,
   forming a light transmission and/or absorption film over the oxide film, and
   applying pulsed laser light only to a predetermined portion of the oxide film from above the light transmission and/or absorption film to crystallize the oxide in the predetermined portion, so that a ferroelectric film is formed.

4. A method of forming a ferroelectric film comprising:
   applying pulsed laser light or pulsed lamp light to an amorphous oxide film formed over a substrate,
   after the applying of pulsed laser light or pulsed lamp light to the amorphous oxide film, forming a light transmission and/or absorption film over the oxide film, and
   applying pulsed laser light or pulsed lamp light to the oxide film from above the light transmission and/or absorption film to crystallize the oxide, so that a ferroelectric film is formed.

5. The method of forming a ferroelectric film as defined in claim 2, further comprising:
   forming a light blocking film over the light transmission and/or absorption film and over the oxide film in a portion other than the predetermined portion in which microcrystalline nuclei is formed.

6. The method of forming a ferroelectric film as defined in claim 2, further comprising:
   wherein the light transmission and/or absorption film is formed over the oxide film only in the predetermined portion, and
   wherein a light blocking film is formed over the oxide film in a portion other than the predetermined portion.

7. The method of forming a ferroelectric film as defined in claim 1,
   wherein the light transmission and/or absorption film is formed by using an oxide conductor.

8. The method of forming a ferroelectric film as defined in claim 1,
   wherein the amorphous oxide film is formed over the substrate with at least a light reflection film interposed in between.

9. The method of forming a ferroelectric film as defined in claim 1,
   wherein intensity of light applied to the amorphous oxide film differs from intensity of light applied for crystallizing the oxide.

10. The method of forming a ferroelectric film as defined in claim 1,
    wherein a number of pulses of light applied to the amorphous oxide film differs from a number of pulses of light applied for crystallizing the oxide.

11. The method of forming a ferroelectric film as defined in claim 1,
    wherein the ferroelectric film has a perovskite crystal structure.

12. The method of forming a ferroelectric film as defined in claim 1,
    wherein the ferroelectric film has a layered perovskite crystal structure.

13. A method of manufacturing a ferroelectric memory comprising forming a ferroelectric layer by using the method of forming a ferroelectric film as defined in claim 1.

14. The method of manufacturing a ferroelectric memory as defined in claim 13, further comprising:
    etching at least the oxide film including the microcrystalline nuclei when forming the ferroelectric layer,
    wherein the etching is performed at least before crystallizing the oxide.

15. The method of manufacturing a ferroelectric memory as defined in claim 13,
    wherein the light transmission and/or absorption film provided over the ferroelectric layer is formed as an electrode when forming the ferroelectric layer.

16. A method of manufacturing a ferroelectric memory including memory cell arrays stacked over a substrate, comprising:

forming upper electrodes of the memory cell arrays as light transmission and/or absorption films, and forming the ferroelectric layers of the memory cell arrays by using a method of forming a ferroelectric film, the method comprising:

applying pulsed laser light or pulsed lamp light to an amorphous oxide film formed over lower electrode of the memory cell array to form microcrystalline nuclei of oxide in the oxide film, forming the upper electrode over the oxide film, and applying pulsed laser light or pulsed lamp light to the oxide film from above the upper electrode to crystallize the oxide, so that a ferroelectric film is formed.

17. The method of manufacturing a ferroelectric memory as defined in claim 16, wherein, after stacking at least two of the memory cell arrays, the ferroelectric layer is formed by crystallizing oxide in each of the memory cell arrays.

18. A method of manufacturing a semiconductor device which includes a memory cell region having a ferroelectric layer and a circuit region, the method comprising:

forming the memory cell region in a predetermined area over a substrate, and forming the circuit region over the substrate in an area other than the memory cell region, and wherein, when forming the memory cell region, a light blocking film is formed over the circuit region, and the ferroelectric layer is formed by using the method of forming a ferroelectric film after forming at least the light blocking film, the method comprising:

applying pulsed laser light or pulsed lamp light to an amorphous oxide film formed over a substrate to form microcrystalline nuclei of oxide in the oxide film, forming a light transmission and/or absorption film over the oxide film, and applying pulsed laser light or pulsed lamp light to the oxide film from above the light transmission and/or absorption film to crystallize the oxide, so that a ferroelectric film is formed.

\* \* \* \* \*